United States Patent
Kasprak et al.

(10) Patent No.: US 10,747,931 B2
(45) Date of Patent: Aug. 18, 2020

(54) SHIFT OF CIRCUIT PERIPHERY LAYOUT TO LEVERAGE OPTIMAL USE OF AVAILABLE METAL TRACKS IN PERIPHERY LOGIC

(71) Applicant: Advanced Micro Devices, Inc., Sunnyvale, CA (US)

(72) Inventors: Keith Kasprak, Austin, TX (US); Patrick W. Shaw, Austin, TX (US)

(73) Assignee: Advanced Micro Devices, Inc., Santa Clara ( * ) Notice: Subject to any disclaimer, the term of this patent is extended or adjusted under 35 U.S.C. 154(b) by 148 days.

(21) Appl. No.: 15/663,132

(22) Filed: Jul. 28, 2017

(65) Prior Publication Data

US 2019/0034572 A1 Jan. 31, 2019

(51) Int. Cl.
*G06F 30/392* (2020.01)
*H01L 27/02* (2006.01)
(Continued)

(52) U.S. Cl.
CPC .......... *G06F 30/392* (2020.01); *G06F 30/394* (2020.01); *G06F 30/398* (2020.01); *H01L 27/0207* (2013.01); *H01L 27/1116* (2013.01)

(58) Field of Classification Search
CPC . H01L 2224/73265; H01L 2224/73204; H01L 2924/00014; H01L 2924/1305; H01L 2924/00015; H01L 27/105; H01L 27/1128; H01L 27/11521; H01L 2924/1431; A61B 2034/2051; A61B 2017/00039;
(Continued)

(56) References Cited

U.S. PATENT DOCUMENTS 5,889,329 A 3/1999 Rostoker et al.
7,231,624 B2 * 6/2007 Vuong .................. G06F 30/394
716/122
(Continued)

FOREIGN PATENT DOCUMENTS

WO 2007073599 A1 7/2007

OTHER PUBLICATIONS

International Search Report and Written Opinion in International Application No. PCT/US2017/052775, dated Mar. 26, 2018, 17 pages.

(Continued)

*Primary Examiner* — Binh C Tat
(74) *Attorney, Agent, or Firm* — Kowert Hood Munyon Rankin and Goetzel PC; Rory D. Rankin

(57) ABSTRACT

Systems, apparatuses, and methods for efficiently floor planning a semiconductor chip are disclosed. Within either the processor or the memory of a computing system, each of a first block and a neighboring second block has a same height. A first metal track plan for the first block is unaligned with respect to a second metal track plan for the second block. An offset for moving each track of the second metal plan to align with a track of the first metal track plan is determined where the offset is a fraction of the height. The placement of the second block is shifted by the offset with respect to the first block. The shifted placement of the second block allows the first metal track plan for the first block to use a unidirectional pattern across the first block and the second block.

20 Claims, 8 Drawing Sheets

(51) Int. Cl.
*G06F 30/394* (2020.01)
*G06F 30/398* (2020.01)
*H01L 27/11* (2006.01)

(58) Field of Classification Search
CPC ...... A61B 2217/005; A61B 17/320068; A61B 5/061; A61B 5/683; A61B 5/684; G06F 30/39; G06F 2119/18; G06F 30/394; G06F 30/392; G06F 30/327; G06F 30/398; G06F 30/3312; H04L 63/1416
USPC .................................. 716/100–106, 118–125
See application file for complete search history.

(56) References Cited

U.S. PATENT DOCUMENTS

| | | | |
|---|---|---|---|
| 8,994,404 B1* | 3/2015 | Or-Bach | H03K 19/096 326/41 |
| 9,837,398 B1 | 12/2017 | Rowhani et al. | |
| 2004/0143797 A1* | 7/2004 | Nguyen | G06F 30/30 716/122 |
| 2005/0212562 A1 | 9/2005 | Gliese et al. | |
| 2007/0157144 A1 | 7/2007 | Mai et al. | |
| 2007/0278528 A1 | 12/2007 | Ato et al. | |
| 2009/0108360 A1* | 4/2009 | Smayling | H01L 27/092 257/368 |
| 2009/0187871 A1 | 7/2009 | Cork | |
| 2010/0148219 A1 | 6/2010 | Shimizu | |
| 2013/0087834 A1 | 4/2013 | Park et al. | |
| 2013/0155753 A1 | 6/2013 | Moon et al. | |
| 2014/0145342 A1 | 5/2014 | Schultz et al. | |
| 2014/0264742 A1 | 9/2014 | Yen et al. | |
| 2016/0276287 A1 | 9/2016 | Iwabuchi | |
| 2017/0011999 A1 | 1/2017 | Heo | |
| 2017/0154848 A1 | 6/2017 | Fan et al. | |
| 2018/0090440 A1 | 3/2018 | Schultz et al. | |
| 2018/0183414 A1 | 6/2018 | Guo et al. | |
| 2019/0065650 A1 | 2/2019 | Pelloie | |
| 2019/0155979 A1 | 5/2019 | Schultz | |

OTHER PUBLICATIONS

International Search Report and Written Opinion in International Application No. PCT/US2018/052369, dated Jan. 7, 2019, 16 pages.

Non-Final Office Action in U.S. Appl. No. 15/819,879, dated Mar. 18, 2019, 10 pages.

Schultz, Richard T., U.S. Appl. No. 15/965,311, entitled "Metal Zero Contact Via Redundancy on Output Nodes and Inset Power Rail Architecture", filed Apr. 27, 2018, 36 pages.

Notice of Allowance in U.S. Appl. No. 15/965,311, dated Jun. 5, 2019, 8 pages.

* cited by examiner

SHIFT OF CIRCUIT PERIPHERY LAYOUT TO LEVERAGE OPTIMAL USE OF AVAILABLE METAL TRACKS IN PERIPHERY LOGIC

BACKGROUND

Description of the Relevant Art

A computing system includes at least one processing unit coupled to a memory. The processing unit processes instructions by fetching instructions and data, decoding instructions, executing instructions, and storing results. The processing unit sends memory access requests to the memory for both fetching instructions and data and storing results of computations. For semiconductor chips with multiple processing units, the demand for memory increases. A larger amount of memory provides both sufficient storage for each processing unit and sharing of more information across the multiple processing units.

In some embodiments, the processing unit and the memory are on a same die. In other embodiments, the processing unit and the memory are on different dies within a same package such as a system-on-a-chip (SOC). Other components, such as an interface unit, are also on the die or the package. Each of the memory, the at least one processing unit, an interface unit, and other components, use any of a variety of types of blocks. The types of blocks include at least custom blocks using full custom circuit design, synthesized blocks using a synthesis tool, and so on. The memory, the at least one processing unit, and other components are placed on the same die or the same package according to a floorplan. The floorplan is a graphical representation of the partitioning of the die or package area. For each of the memory, processing unit, or other components, the partitioning uses a selected shape of one or more available shapes to represent the placement of the component. In many cases, the selected shape used for the floorplan is a rectangle and the selected shape has particular geometric dimensions such as a height and a width.

The dimensions of the selected shapes have limits in order to place all of the components on the same die or the same package. The limits are set by various factors such as area for bonding pads, input/output (I/O) line drivers for signals corresponding to the bonding pads, timing constraints of macro blocks, predefined rectangles for the at least one processing unit and other intellectual property blocks (IP blocks) from a third party, tracks used for routing metal rails of a power grid, tracks used for routing metal layers corresponding to signals within blocks and between blocks, and reserved areas.

In many instances, the signals between two blocks use pins in a first block which are unaligned with pins on the other second block. Similarly, the signals between two blocks within a block use pins in a first block which are unaligned with pins on the other second block. In other instances, the pitch for the signals in the first block does not match the pitch for the signals in the other second block. Therefore, the routing of the signals uses bends and/or L-shapes between the two blocks. Metal routes with bends and/or L-shapes are referred to as bidirectional routes. "Jogging" a metal route as used herein refers to creating a bend or an L-shape in the metal route, which makes the metal route a bidirectional metal route. Metal routes with no bends or L-shapes are referred to as unidirectional routes. When each of the first block and the second block are placed many times to create a larger block, such as a macro block, the jogging of the metal routes for the signals is also repeated. However, as fabrication processes become more advanced, and the geometric dimensions of devices and metal layers reduce, the on-die spacing penalty for jogging signals has become appreciable.

In view of the above, efficient methods and systems for efficiently floor planning a semiconductor chip are desired.

BRIEF DESCRIPTION OF THE DRAWINGS

The advantages of the methods and mechanisms described herein may be better understood by referring to the following description in conjunction with the accompanying drawings, in which.

Figure 1:
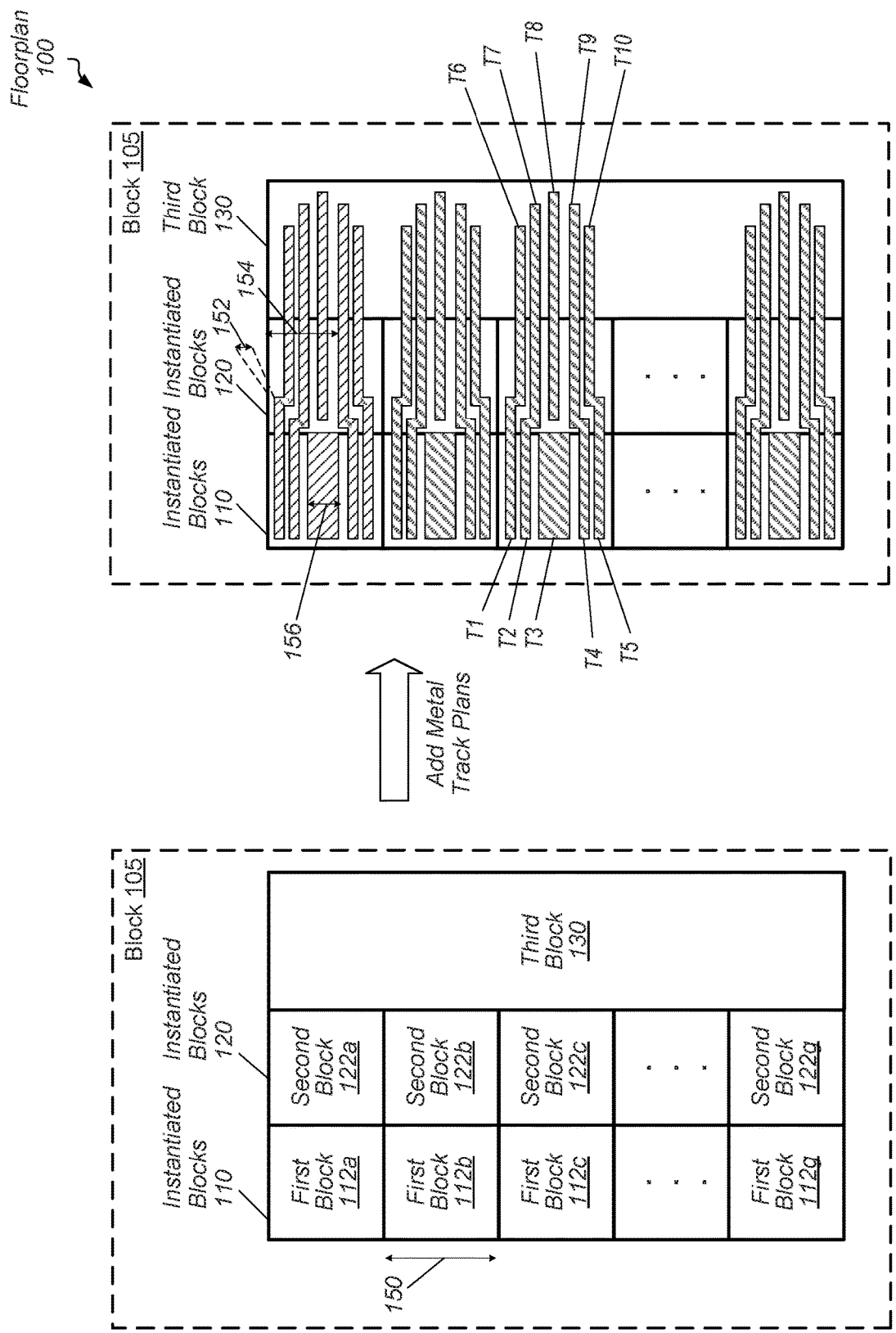
FIG. 1 is a block diagram of one embodiment of block placement and metal track plans within a floorplan.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for efficiently floor planning a semiconductor chip are disclosed. In various embodiments, a computing system uses a first block and a second block, each with a same height. The second block is a neighbor of the first block in a floorplan. However, a first metal track plan for the first block is unaligned with respect to a second metal track plan for the second block. An offset for moving each track of the second metal plan to align with a track of the first metal track plan is determined where the offset is a fraction of a height of the second block and the first block. The placement of the second block is shifted such that the top of the second block is unaligned with the top of the first block by the offset.

The shifted placement of the second block allows the first metal track plan for the first block to use a unidirectional pattern across the first block and the second block. The unidirectional pattern of the first metal track plan uses a width and a pitch for a given metal layer with no bends or L-shapes used for routing signals across the first block and the second block. In some embodiments, the second metal track plan includes one or more tracks widened after being moving by the offset to align the second metal track plan with the first metal track plan.

In an embodiment, each of the first block and the shifted second block is instantiated multiple times next to each other to create a larger block. In some embodiments, the larger block is a macro block. The unidirectional first metal track plan is repeated across each instantiated pair of the first block and the shifted second block. In some embodiments, the first block is a memory bit cell and the second block is a periphery block comprising control logic for accessing the memory bit cell. In an embodiment, at least a third block different from each of the first block and the second block is placed in an unoccupied area created by the unaligned placement of the second block with respect to the first block. A further description of the steps of floor planning to avoid a transition in patterns of a metal track plan across the first block and the second block is provided in the below discussion.

Referring to FIG. 1, one embodiment of block placement and metal track plans within a floorplan 100 is shown. In the illustrated embodiment, block 105 uses instantiated blocks 110 in addition to the neighboring instantiated blocks 120. The instantiated blocks 110 use multiple copies of a block such as the first blocks 112a-112g. Similarly, the instantiated blocks 120 use multiple copies of a block such as the second blocks 122a-122g. The floor planning of the block 105 connects by abutment each one of the first blocks 112a-112g with one of the second blocks 122a-122g. In some embodiments, one or more other blocks, such as block 130, are placed next to the instantiated blocks 120.

In an embodiment, the block 105 is a macro block using the first blocks 112a-112g, the second blocks 122a-122g and the third block 130 together to provide the functionality of the block 105 since each provides partial functionality of the block 105. In some embodiments, the block 105 is used in interface logic. In other embodiments, the block 105 is used in a processing unit. In yet other embodiments, the block 105 is used in a memory. In still other embodiments, the block 105 is used within one of a variety of functional units used in one of a variety of computing systems such as a desktop, a portable computer, a mobile device, a server, a peripheral device, or other. In some embodiments, the block 105 is implemented on a single die, such as a single integrated circuit. In other embodiments, the functionality of the block 105 is included as multiple dies on a system-on-a-chip (SOC).

In various other embodiments, the first blocks 112a-112g, the second blocks 122a-122g and the third block 130 are any of a variety of types of blocks. In an embodiment, one or more of the instantiated blocks 110, the instantiated blocks 120 and the third block 130 are custom blocks utilizing full custom circuit design and custom layout performed by designers. In another embodiment, one or more of the instantiated blocks 110, the instantiated blocks 120 and the third block 130 are place and route blocks, which are also referred to as synthesized blocks. Synthesized blocks are created by designers using a synthesis tool and a description of the hardware functionality of the block in a high level programming language.

In yet another embodiment, one or more of the instantiated blocks 110, the instantiated blocks 120 and the third block 130 are intellectual property (IP) blocks, which provide dimensions of one or more available shapes, electrical properties and a pinout map describing the locations of input/output (I/O) pins. However, there may be no structural description of the provided functionality of the IP block since an IP block comes from a third party. Unless specifically noted, a "block" as used herein can be any one of a full custom block, a synthesis block, or an IP block.

As shown, each one of the first blocks 112a-112g has a same height, which is shown as height 150, as each one of the second blocks 122a-122g. Additionally, each of the first blocks 112a-112g and the second blocks 122a-122g has a metal track plan. The metal track plan for a given metal layer defines a width of the metal tracks potentially used to route signals or power supply values. The metal track plan also defines a pitch of the metal tracks. The pitch used for the block 105 and a semiconductor chip in general refers to a minimum allowable distance between two entities. In various embodiments, different pitches are used for different entities. Examples of the entities are transistor gates and two metal lines on a particular metal layer in a fabrication process. The pitch-matching between two components allows connection of the two components by abutment and no extra on-die area is used for wire routes (metal lines) between the two components.

In addition, the power supply and ground reference lines may have fixed locations for the pitch-matched components. Further, each of the pitch-matched components may have a fixed height or a fixed width. For the components to be pitch-matched to the die or package, the components are located on the die at a distance that is an integer multiple of a pitch match measured from a given corner of the die, such as the bottom left corner of the die. Therefore, tracks for the block 105 are located on a die of a semiconductor chip at a distance that is an integer multiple of a pitch match measured from a given corner of the die such as the bottom left corner of the die.

The metal track plan further defines a pattern of the metal tracks. A unidirectional pattern of a metal track plan uses a width and a pitch for tracks used for a given metal layer with no bends or L-shapes used for routing across one or more blocks. As shown in the figure on the right, metal track plans for each of the first blocks 112a-112g are added to the block 105. The metal tracks are shown as the darker gray lines running over the first blocks 112a-112g. The metal track plan uses tracks T1 to T5, each with a defined width and a defined pitch with respect to a neighboring track. Multiple copies of the metal track plan using tracks T1 to T5 are placed in the block 105. Similarly, metal track plans for each of the second blocks 122a-122g are added to the block 105. The metal tracks are shown as the darker gray lines running over the second blocks 122a-122g and the third block 130. In the illustrated embodiment, this metal track plan is used by the second blocks 122a-122g and the third block 130. This metal track plan uses tracks T6 to T10, each with a defined width and a defined pitch with respect to a neighboring track. Multiple copies of the metal track plan using tracks T6 to T10 are placed in the block 105.

As can be seen in block 105 on the right, the metal track plan with tracks T1 to T5 uses a unidirectional pattern within the first blocks 112a-112g. Similarly, the metal track plan with tracks T6 to T10 uses a unidirectional pattern within the second blocks 122a-122g. However, the separate metal track plans are unaligned. Therefore, when the separate metal track plans meet, the darker gray lines representing the metal tracks have L-shaped lines as well as differences in widths and spacing. It is desirable to restrict the metal tracks used for the signal routing to unidirectional metal patterns. Metal tracks and the corresponding metal routes that do not use bends or L-shapes are described as using unidirectional metal patterns. In contrast, metal tracks that use bends or L-shapes are described as using bidirectional metal patterns. Bidirectional metal patterns provide bidirectional metal routes for signals, which are also referred to as "jogged" metal routes or the metal routes include "jogging." It is also noted the terms wire routes, metal routes, and signal routes are interchangeable.

Although each of the first blocks 112a-112g and the second blocks 122a-122g within the block 105 have a same height, which is shown as height 150, and each of the first blocks 112a-112g is connected by abutment to one of the second blocks 122a-122g, for various reasons, the available metal tracks between them are bidirectional as shown in FIG. 1. The placement of the tracks is the reason for the bidirectional metal tracks across the first blocks 112a-112g and the second blocks 122a-122g. For example, the placement of the tracks T1-T5 is unaligned with the placement of the tracks T6-T10. One possible reason for the unaligned placement, which causes the bidirectional pattern for the tracks across the first blocks 112a-112g and the second blocks 122a-122g, is the pins of each of the first blocks 112a-112g are unaligned with the pins of a corresponding one of the second blocks 122a-122g.

A second possible reason for the unaligned placement, which causes the bidirectional pattern of the metal tracks, is the pitch(es) for the metal tracks in each of the first blocks 112a-112g do not match the pitch(es) for the metal tracks in a corresponding one of the second blocks 122a-122g. For example, one or more of the width of the metal tracks used for the signal routes is different across the blocks and the spacing between the metal tracks is different. As shown, the width of the metal track T3, which is the third metal track from the top of the metal plan for each of the first blocks 112a-112g, is significantly wider than the width for the metal track T8. As shown, the track T3 has the width 156, which is significantly wider than the width for the metal track T8. The metal track T8 is the third metal track from the top of the metal plan for each of the second blocks 122a-122g. The significantly wide track T3 causes the placements of the tracks T1-T2 to move up higher than the placement of the tracks T6-T7. In addition, the significantly wide track T3 causes the placements of the tracks T4-T5 to move down lower than the placement of the tracks T9-T10. For recent chip designs, the on-die spacing penalty for bidirectional metal tracks has become appreciable.

To provide unidirectional metal tracks for the routing of the signals, in one example, self-aligned double patterned (SADP) breaks are created for the particular metal layers used to route the signals across different blocks. However, the created separation, which is referred to as an SADP break, causes an appreciable area penalty in the block 105. The area penalty causes the width of the block 105 to increase, which reduces scaling and performance. Another technique to satisfy the desired routing of the signals, but without creating an SADP break, is to shift each of the second blocks 122a-122g in relation to the first blocks 112a-112g. For example, if the metal track plan for the second blocks 122a-122g is moved up or moved down by a particular amount, the metal tracks T6-T10 will align with the metal tracks T1-T5. The metal tracks T6-T10 are moved when the second blocks 122a-122g are moved together, and thus, have their placement shifted with respect to the placement of the first blocks 112a-112g.

In one example, the distance from the top of the track T9 to the top of the track T1 represents a particular distance for shifting the placement of the tracks T6-T10 which causes the tracks T6-T10 to align with the placement of the tracks T1-T5. This distance is referred to as the offset. Therefore, the offset in this example is the top of the fourth track (T9) of one metal track plan to the top of the first track (T1) of the other metal track plan. Similarly, for alignment, the offset is also the distance from the top of the track T6 to the top of the track T4. Therefore, the offset in this example is the top of the first track (T6) of one metal track plan to the top of the fourth track (T4) of the other metal track plan. In a similar manner, for alignment, the offset is the distance between the tops of the tracks T10 and T2 as well as the distance between the tops of the tracks T7 and T5.

The offset in this example is the distance 154 subtracting the distance 152. The distance 154 is the distance from the top of one of the second blocks 122a-122g to the top of the metal track T9 in the metal track plan for the second blocks 122a-122g. The distance 152 is shown in a magnified manner and it is the distance from the top of one of the first blocks 112a-112g to the top of the metal track T1 in the metal track plan for the first blocks 112a-112g. The offset is a particular fraction of the height 150. The created alignment allows only one of the two separate metal track plans to be retained. In this example, the metal track plan for the first blocks 112a-112g is retained.

Figure 2:
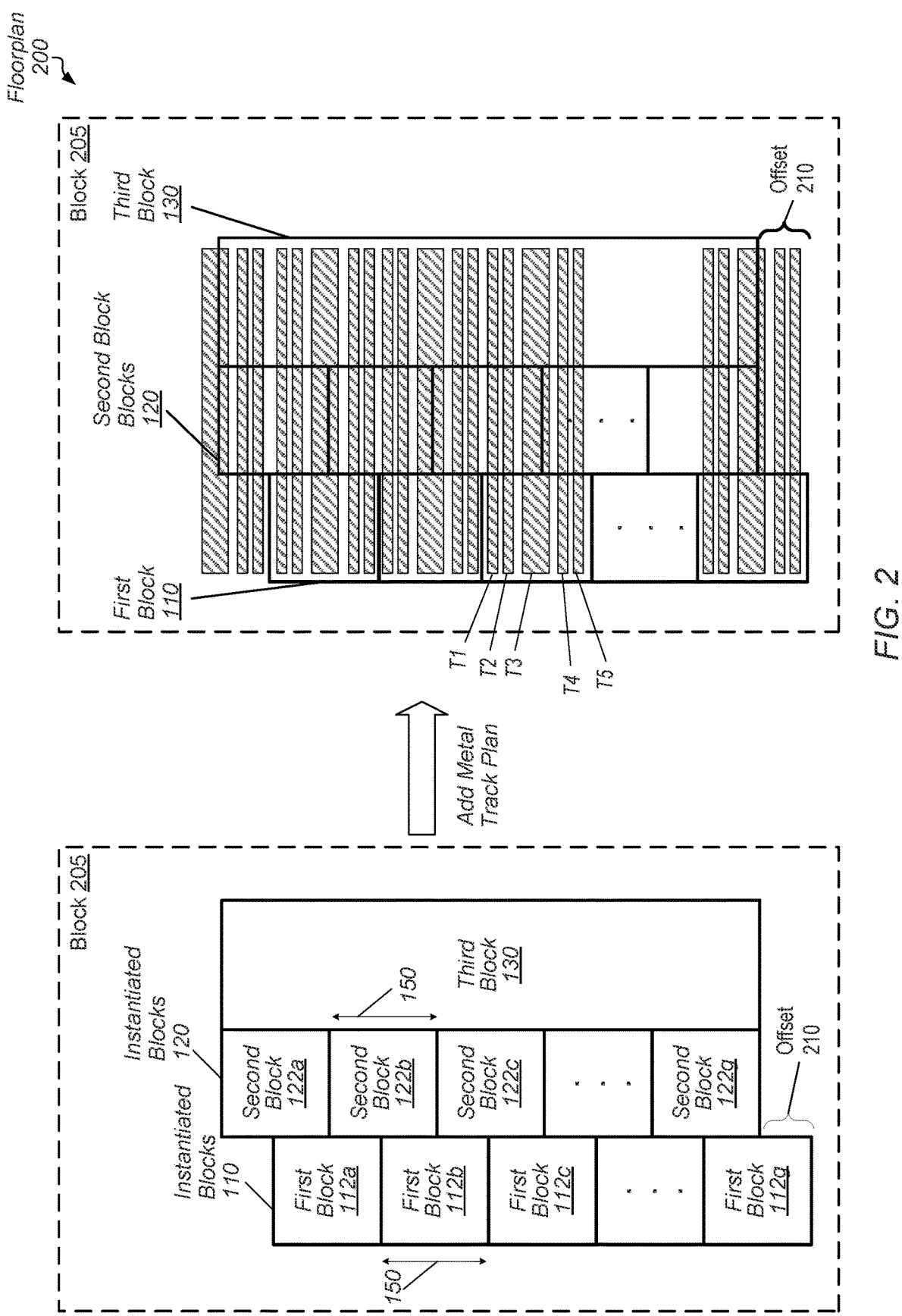
FIG. 2 is a block diagram of another embodiment of block placement and metal track plans within a floorplan.

Turning now to FIG. 2, another embodiment of block placement and metal track plans within a floorplan 200 is shown. Blocks with circuitry and logic described earlier are numbered identically. In the illustrated embodiment, block 205 uses instantiated blocks 110 in addition to the neighboring instantiated blocks 120. In some embodiments, one or more other blocks, such as block 130, are placed next to the instantiated blocks 120. The floor planning of the block 205 connects by abutment the instantiated blocks 110 with the neighboring instantiated blocks 120. However, the placement of the instantiated blocks 120 and the third block 130 is shifted by the offset 210 with respect to the placement of the instantiated blocks 110.

In various embodiments, the offset 210 is a particular fraction of the height 150. In an embodiment, the particular fraction of the height 150 is one half of the height 150. In such an embodiment, the offset 210 is one half of the cell height of any one of the first blocks 112a-112g and the second blocks 122a-122g. However, a variety of other fractions are possible and contemplated. In various embodiments, the offset 210 is determined in a manner described earlier for aligning two separate metal track plans. The alignment created by the shifted placement of the second blocks 122a-122g and the third block 130 allows only one of the two separate metal track plans to be retained. In the illustrated embodiment, the earlier metal track plan for the first blocks 112a-112g is retained over the metal track plan for the second blocks 122a-122g.

As shown in the figure on the right, metal track plans for each of the first blocks 112a-112g are added to the block 205. The metal tracks are shown as the darker gray lines running over each of the first blocks 112a-112g, the second blocks 122a-122g and the third block 130. The metal track plan uses tracks T1 to T5. Multiple copies of the metal track plan using tracks T1 to T5 are placed in the block 205. The added copies of the tracks T1 to T5 use a unidirectional metal pattern. There are no bends or L-shapes in any of the metal tracks placed in the block 205 since they do not contain differences in widths and spacing between the first blocks 112a-112g and the second blocks 122a-122g. Therefore, only unidirectional metal tracks are used across each of the first blocks 112a-112g and the second blocks 122a-122g although the transistors in the second blocks 122a-122g do not align as they have historically.

Generally, the devices (transistors) in each of the second blocks 122a-122g are aligned to a block of the first blocks 112a-112g and the second blocks 122a-122g are built for multiple block heights. In various embodiments, the shifting by the offset 210 provides an optimal set of unidirectional tracks of one or more metal layers between the first blocks 112a-112g and the second blocks 122a-122g. Therefore, the shifting by the offset 210 of the second blocks 122a-122g, and the transistors comprised within, causes the transistors to no longer be aligned with a block of the first blocks 112a-112g and provides unidirectional routes for the metal track plan for the first blocks 112a-112g.

In various embodiments, edge cells are placed in the unoccupied areas created above and below the first blocks 112a-112g after the shifting of the second blocks 122a-122g and the third block 130. The placement of the edge cells in the floorplan is done so that the shift by the offset 210 does not cause area growth for the block 205. Although the shifting of the placement of the second blocks 122a-122g and the third block 130 by the offset 210 shows the top of the second blocks 122a-122g being located above the tops of the first blocks 112a-112g, in other embodiments, the shifting is performed in the other direction where the tops of the second blocks 122a-122g are located below the tops of the first blocks 112a-112g. In various embodiments, the shifting by the offset 210 allows both the use of the metal track plan for the first blocks 112a-112g and the use of unidirectional metal tracks in the block 205.

Figure 3:
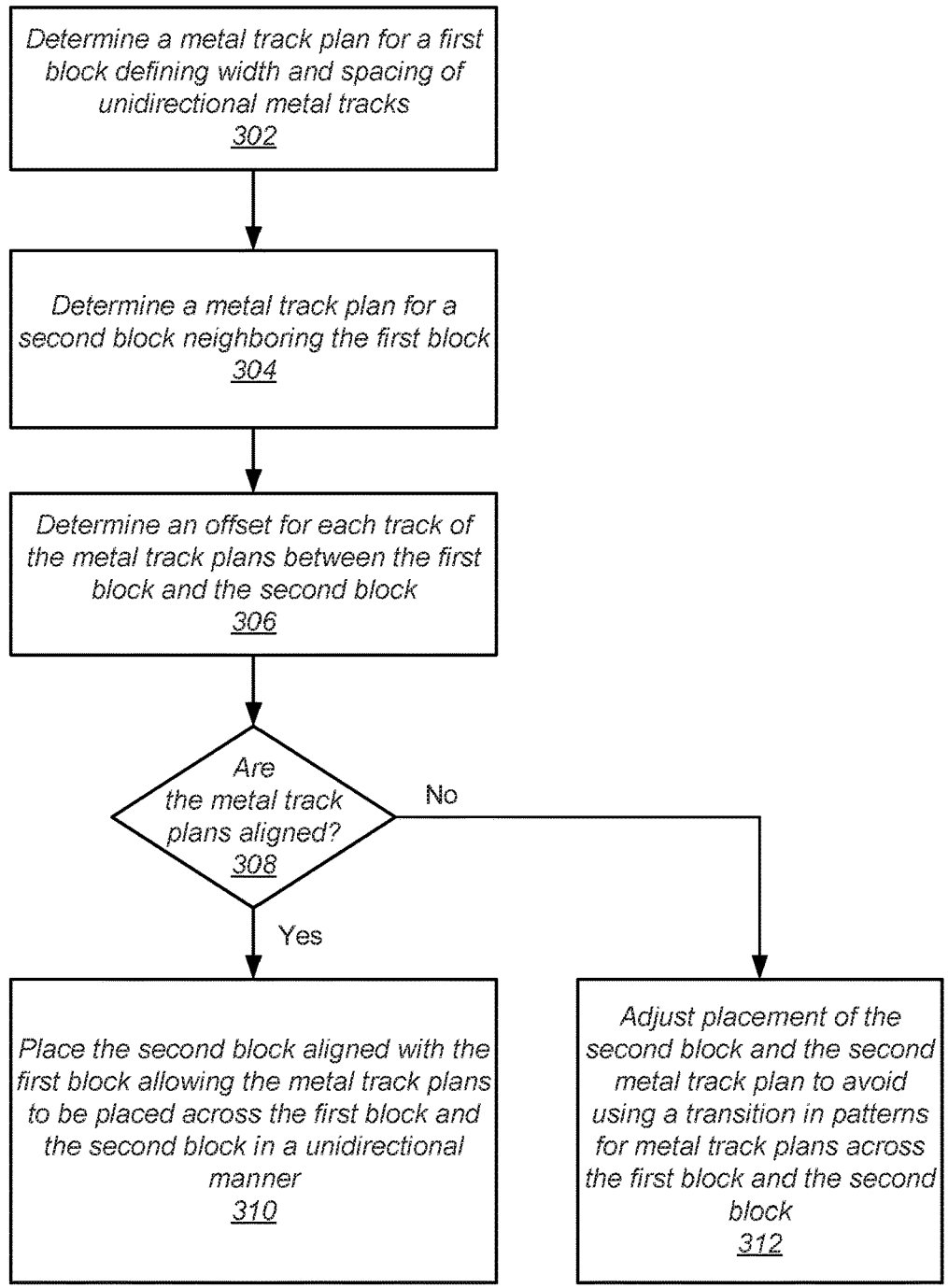
FIG. 3 is a flow diagram illustrating one embodiment of a method for placing blocks and metal track plans for a floorplan.

Referring now to FIG. 3, a generalized flow diagram of one embodiment of a method 300 for efficiently floor planning a semiconductor chip is illustrated. For purposes of discussion, the steps in this embodiment (as well as in FIG. 4) are shown in sequential order. However, in other embodiments some steps occur in a different order than shown, some steps are performed concurrently, some steps are combined with other steps, and some steps are absent. In various embodiments, the method described in FIG. 3 and FIG. 4 may be performed by a computing system. For example, in some embodiments the computing system comprising a design tool (e.g., hardware and/or software) configured to perform the methods described below in order to generate a floor plan for one or more memories. In other embodiments, the computing system may comprise a fabrication tool configured to perform the method(s) in order to fabricate one or more memories or cause one or more other fabrication tools to fabricate one or more memories.

A metal track plan is determined for a first block defining width and spacing of unidirectional metal tracks (block 302). A metal track plan is determined for a second block neighboring the first block (block 304). An offset is determined for each track of the metal track plans between the first block and the second block (block 306). If the metal track plans are aligned ("yes" branch of the conditional block 308), then the second block is placed aligned with the first block allowing the metal track plans to be placed across the first block and the second block in a unidirectional manner (block 310). However, if the metal track plans are not aligned ("no" branch of the conditional block 308), then placement of the second block and the second metal track plan are adjusted to avoid using a transition in patterns for metal track plans across the first block and the second block (block 312).

Figure 4:
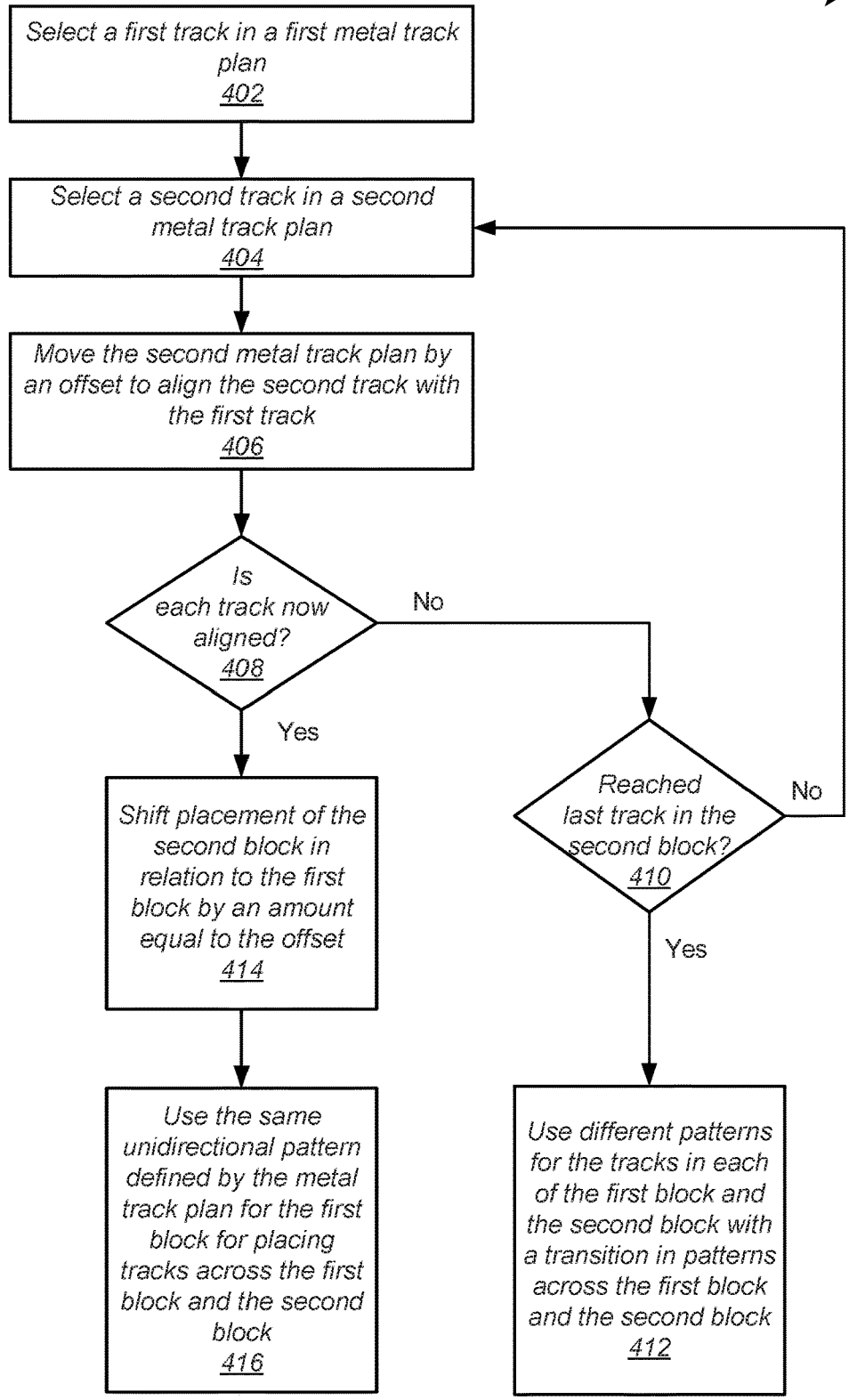
FIG. 4 is a flow diagram illustrating another embodiment of a method for placing blocks and metal track plans for a floorplan.

Referring now to FIG. 4, a generalized flow diagram of one embodiment of a method 400 for efficiently floor planning a semiconductor chip is illustrated. A first track in a first metal track plan for a first block is selected (block 402). A second track in a second metal track plan for a second block neighboring the first block is selected (block 404). The second metal track plan is moved by an offset to align the second track with the first track (block 406). If each track of the second metal track plan is still not aligned with a track in the first metal track plan ("no" branch of the conditional block 408), and the last track in the second block has not been reached ("no" branch of the conditional block 410), then control flow of method 400 return to block 404 where another track is selected in the second metal track plan. However, if the last track in the second block has been reached ("yes" branch of the conditional block 410), then different patterns for the tracks are used in each of the first block and the second block with a transition in patterns across the first block and the second block (block 412). For example, self-aligned double patterned (SADP) breaks are created for the particular metal layers used to route the signals between the SRAM cell and the corresponding periphery cells. However, the created separation, which is referred to as an SADP break, causes an appreciable area penalty in the SRAM macro block. The area penalty causes the width of the memory array to increase, which reduces array scaling and array performance.

After moving the selected second metal track plan by an offset to align the second track with the first track (block 406), if each track of the second metal track plan is aligned with a track in the first metal track plan ("yes" branch of the conditional block 408), then placement of the second block is shifted in relation to the first block by an amount equal to the offset (block 414). The same unidirectional pattern defined by the metal track plan for the first block is used for placing tracks across the first block and the second block (block 416).

Figure 5:
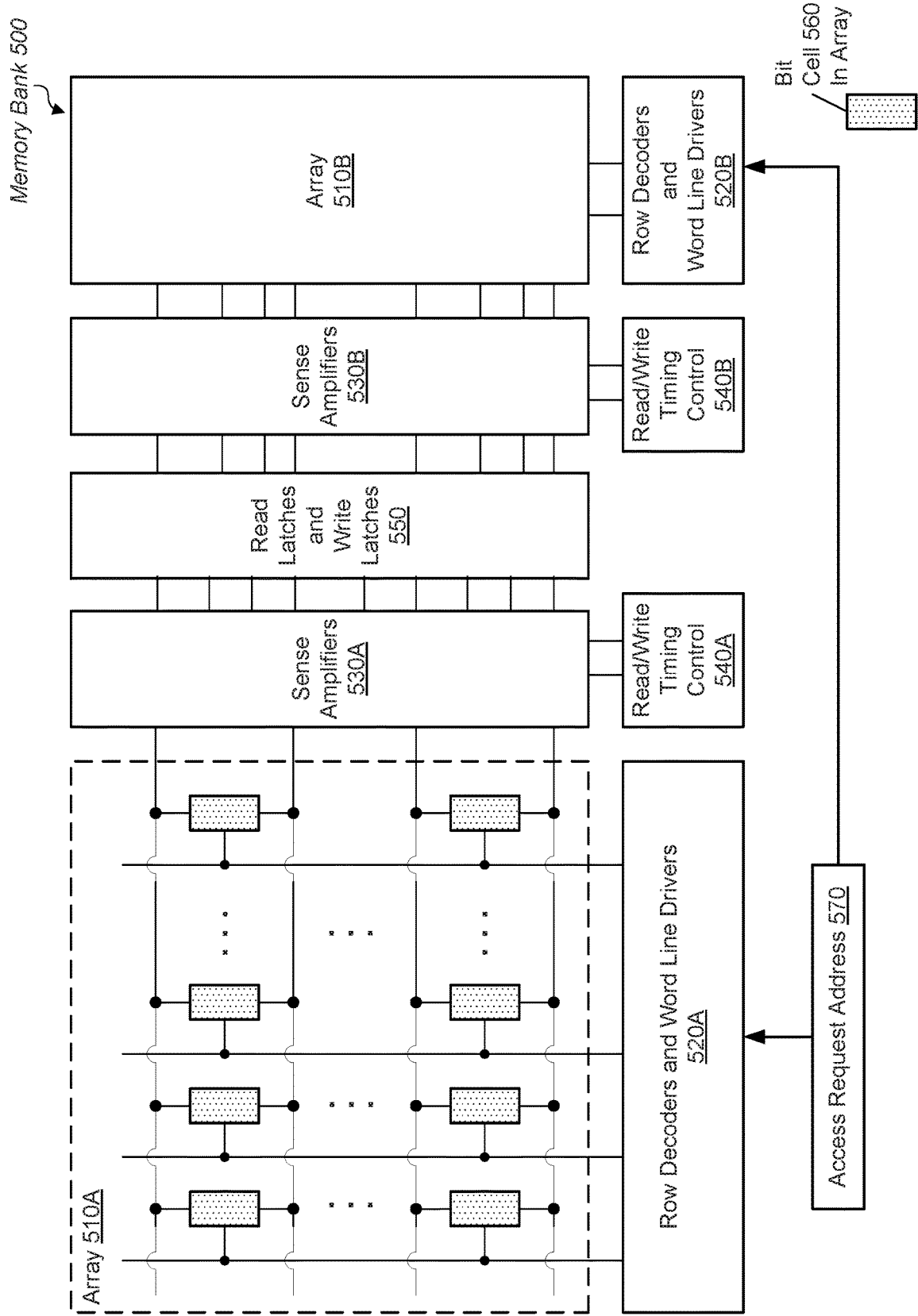
FIG. 5 is a block diagram of an embodiment of a memory bank.

Turning now to FIG. 5, a generalized block diagram of one embodiment of a memory bank 500 is shown. In various embodiments, a memory macro block includes both a left bank and a right bank. The bank 500 is a left bank or a right bank of the memory macro block. In various embodiments, the memory bank 500 is used for a rectangular-shaped or square-shaped memory macro block. As shown, the memory bank 500 includes arrays 510A-510B, row decoders 520A-520B, sense amplifiers 530A-530B between the arrays 510A-510B, read and write timing control logic 540A-540B, and read latches and write latches in block 550.

In various embodiments, each of the blocks 510A-510B, 520A-520B, 530A-530B, 540A-540B and 550 in the memory bank 500 is communicatively coupled to another one of the blocks. For example, direct connections are used wherein routing occurs through another block. Alternatively, staging of signals is done in an intermediate block. In various embodiments, each of the arrays 510A-510B includes multiple memory bit cells 560 arranged in a tiled format. In some embodiments, each one of the memory bit cells is a copied variation of a six-transistor RAM cell selected based on design needs. In other embodiments, another one of various types of RAM cells is used.

The row decoders and word line drivers in blocks 520A-520B receive address information corresponding to an access request. For example, each of the blocks 520A-520B receives the information provided by the access request address 570. Each one of the blocks 520A-520B selects a particular row, or entry, of the multiple rows in an associated one of the arrays 520A-520B. In some embodiments, the blocks 520A-520B use an index portion of the address 570 for selecting a given row, or entry, in an associated one of the arrays 520A-520B. Each row, or entry, stores one or more memory lines.

In the embodiment shown, the rows, or entries, in the arrays 520A-520B are arranged in a vertical orientation. However, in other embodiments, a horizontal orientation is used for storage of the memory lines. For write access requests, the write latches are located in block 550. The write data is driven into the arrays 510A-510B. The timing control logic 540a-540B sets up the write word line driver logic and updates the write latches with new data in block 550. The write data is written into a row of bit cells that is selected by an associated one of the blocks 520A-520B. In some embodiments, precharge circuitry is included in block 550.

For read access requests, the block 550 is used to precharge the read lines routed to the arrays 510A-510B. The timing logic in blocks 540A-540B is used for precharging and setting up the sense amplifiers in the blocks 530A-530B. The timing control logic 540A-540B sets up the read word line driver logic and a selected row selected by an associated one of the row decoders 520A-520B provides its data on the read lines, which are sensed by the sense amplifiers. The read latches capture the read data.

For each of the write access requests and read access requests, the selected row has certain bit cells selected for completion of the access request. In various embodiments, bit separation, which is also referred to as bit interleaving, is used to protect against soft errors. In various embodiments, the row or entry decoding for the memory bank 500 is dependent on a power-of-2 value and sets one dimension of the memory bank 500 such as the width. The dimensions of an individual memory cell 560 arranged in the tiled format sets the other dimension such as the height. In addition, this other dimension is set by the bit separation or interleaving used to defend against soft errors.

In various embodiments, a first block for the memory bank 500 is the memory cell 560 and a neighboring second block is a block for the sense amplifiers 530A or 530B and/or for the latches 550. Multiple copies of each of the first block and the second block are placed in the memory bank 500. Each of the first block and the second block has a metal track plan in the horizontal direction. However, in some embodiments, the metal tracks are unaligned. Using steps described earlier, an offset is determined for moving the metal track plan for the second block to align with the metal track plan of the first block. The placement of the copies of the second block are shifted in relation to the first block by an amount equal to the offset. Now, the same unidirectional pattern defined by the metal track plan for the first block is used for placing tracks across the first block and the second block. In other embodiments, vertical metal track plans are defined for a first block, such as the memory cell 560, and a second block such as a block for the row decoders and word line drivers 520A or 520B. When the metal track plans are unaligned, similar steps are used to shift placement of the second block.

In various embodiments, static random access memory (SRAM) is used for the memory. The SRAM includes an array of many bit cells and a logic portion used for accessing values stored in the array. As described above, the logic portion uses many blocks such as row decoders, word line drivers, sense amplifiers, read and write timing control circuitry for the sense amplifiers, and read and write latches. These many blocks in addition to other interface blocks are also referred to as the periphery logic. In some embodiments, the SRAM uses at least one memory bank such as the memory bank 500. A given periphery block uses one or more of the examples of the periphery logic. When metal track plans are unaligned between a SRAM block and a periphery block, in an embodiment, an offset is determined for moving the metal track plan for the periphery block to align with the metal track plan of the SRAM block. The placement of the copies of the periphery block are shifted in relation to the SRAM block by an amount equal to the offset. Now, the same unidirectional pattern defined by the metal track plan for the SRAM block is used for placing tracks across the SRAM block and the periphery block.

Figure 6:
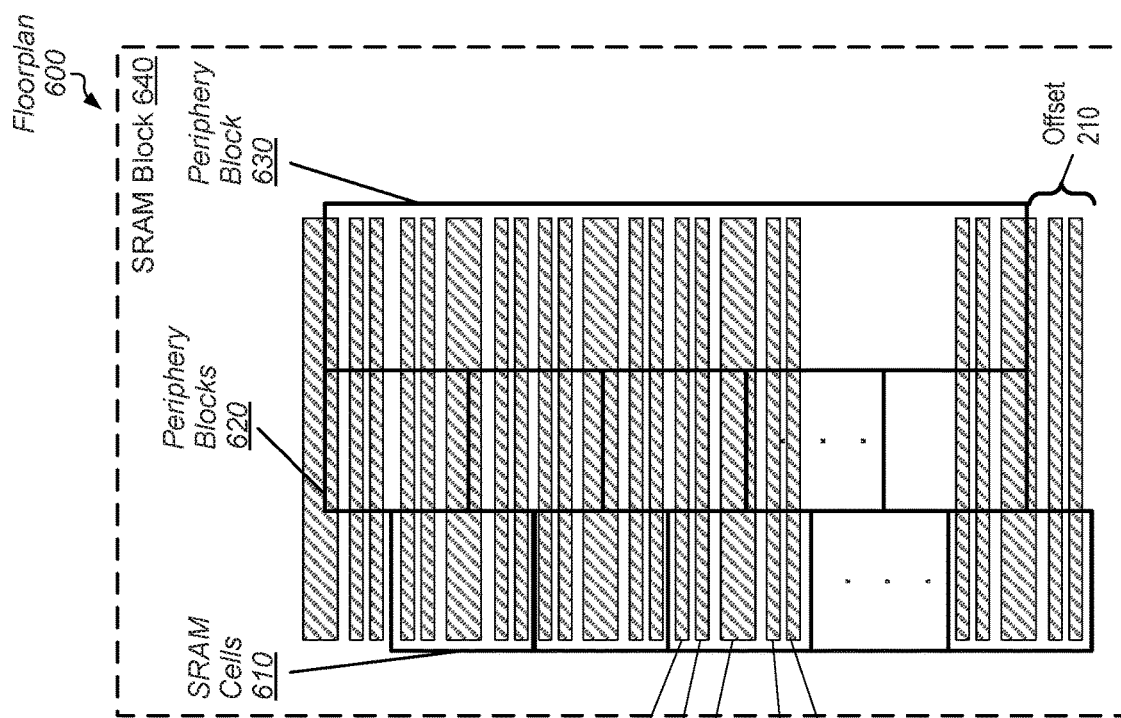
FIG. 6 is a block diagram of another embodiment of block placement and metal track plans within a floorplan.
Figure 6:
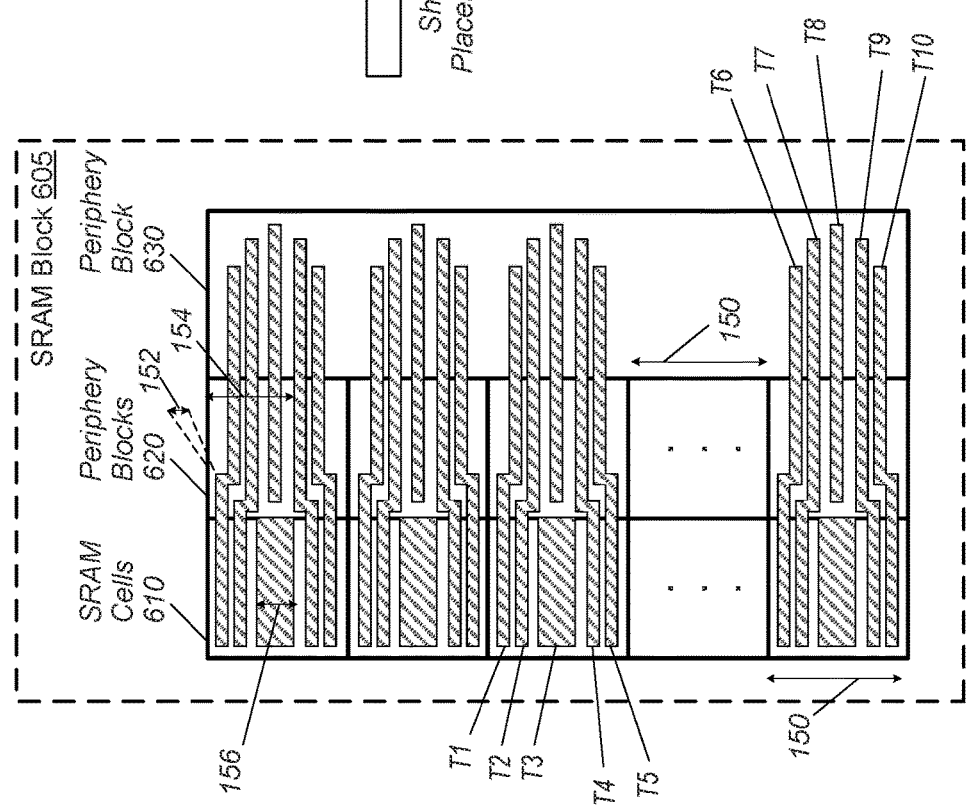

Turning now to FIG. 6, another embodiment of block placement and metal track plans within a floorplan 600 is shown. Blocks with circuitry and logic as well as distances and metal tracks described earlier are numbered identically. In the illustrated embodiment, block 605 uses multiple instantiated SRAM cells 610 in addition to the neighboring and multiple instantiated periphery blocks 620. In some embodiments, one or more other blocks, such as the periphery block 630, are placed next to the multiple instantiated periphery blocks 620.

As shown in the figure on the left, metal track plans for each of the multiple SRAM cells 610 are added to the block 605. The metal tracks are shown as the darker striped gray lines running over the multiple SRAM cells 610. The metal track plan uses tracks T1 to T5, each with a defined width and a defined pitch with respect to a neighboring track. Multiple copies of the metal track plan using tracks T1 to T5 are placed in the block 605. Similarly, metal track plans for each of the multiple periphery blocks 620 are added to the block 605. The metal tracks are shown as the darker striped gray lines running over the multiple periphery blocks 620 and the periphery block 630. This metal track plan uses tracks T6 to T10, each with a defined width and a defined pitch with respect to a neighboring track. Multiple copies of the metal track plan using tracks T6 to T10 are placed in the block 605. As can be seen, the separate metal track plans are unaligned, which causes bidirectional metal patterns in block 605.

On the right of FIG. 6, the floor planning of the block 640 connects by abutment the multiple SRAM cells 610 with the neighboring periphery blocks 620. However, the placement of the multiple periphery blocks 620 and the periphery block 630 is shifted by the offset 210 with respect to the placement of the multiple SRAM cells 610. In various embodiments, the offset 210 is a particular fraction of the height 150. In various embodiments, the offset 210 is determined in a manner described earlier for aligning two separate metal track plans. The alignment created by the shifted placement of the multiple periphery blocks 620 and the periphery block 630 allows only one of the two separate metal track plans to be retained. In the illustrated embodiment, the metal track plan for the multiple SRAM cells 610 is retained over the metal track plan for the multiple periphery blocks 620.

As shown in block 640, the metal tracks are shown as the darker striped gray lines running over each of the multiple SRAM cells 610, multiple periphery blocks 620 and the periphery block 630. The metal track plan uses tracks T1 to T5. Multiple copies of the metal track plan using tracks T1 to T5 are placed in the block 640. The added copies of the tracks T1 to T5 use a unidirectional metal pattern.

Figure 7:
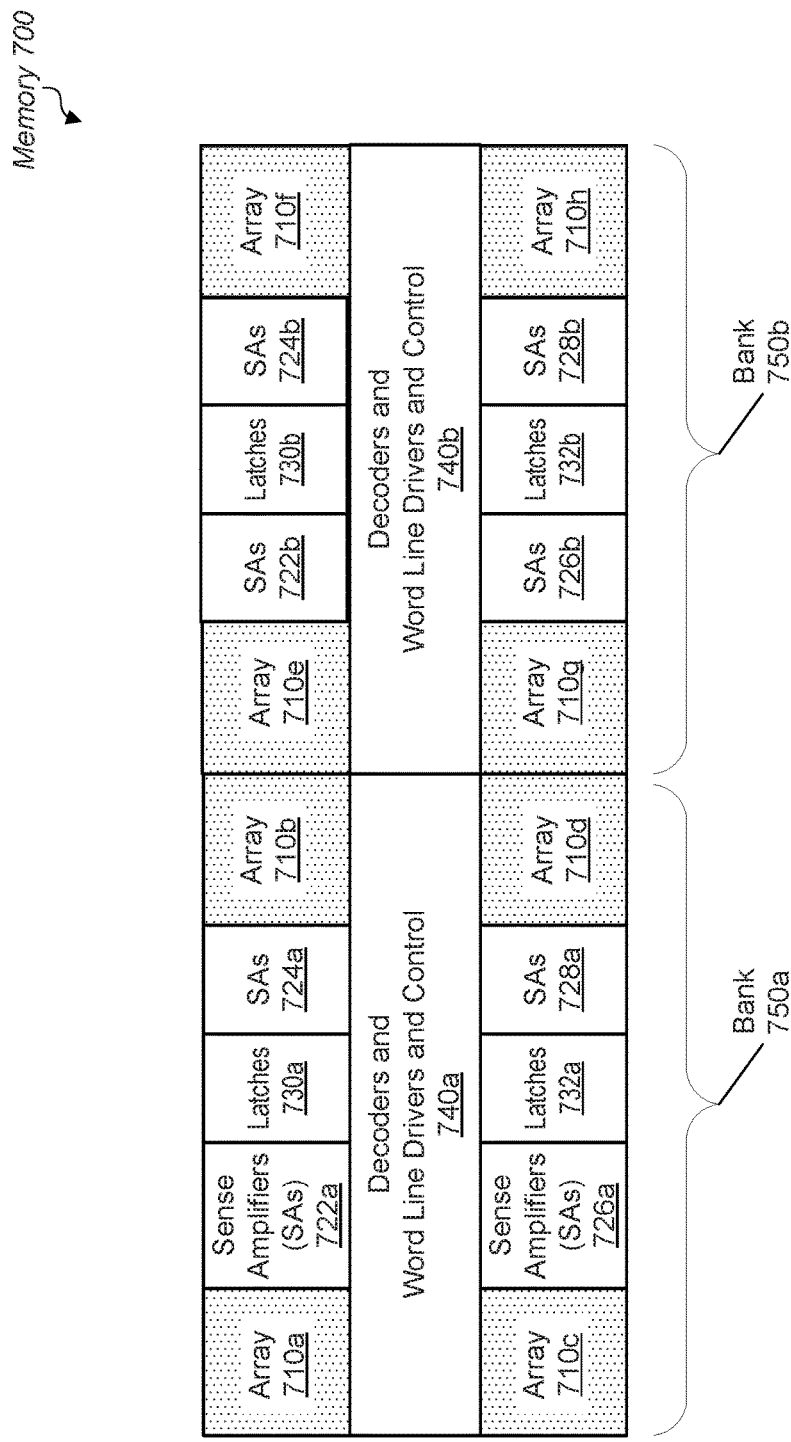
FIG. 7 is a block diagram of an embodiment of a memory.

Turning now to FIG. 7, a generalized block diagram of another embodiment of an efficient memory floorplan 700 is shown. As shown, the bank 750a includes four the arrays 710a-710d and the bank 750b includes the arrays 710e-710h. Using an example with a 64-bit memory line, the top half, such as array 710a, has 32 bits while the bottom half, such as array 710c, also has 32 bits. Similarly, the top half, such as array 710b, has 32 bits and the bottom half, such as array 710d, has 32 bits. The shared sense amplifiers 722a read from a bit line in the array 710a in the top left half of the bank 750a. Similarly, the shared sense amplifiers 726a charges a bit line in the array 710c in the bottom left half of the bank 750a.

The shared sense amplifiers 724a charge a bit line in the array 710b in the top right half of the bank 750a. The shared sense amplifiers 728a charge a bit line in the array 710d in the bottom right half of the bank 750a. The shared sense amplifiers 722b, 724b, 726b and 728b perform similar charging and sensing operations for the bank 750b as the operations described for the bank 750a. Bit lines are read by a shared sense amplifier and stored by a corresponding read latch in the blocks 730a, 732a, 730b and 732b. The completion of an access request for all bits (e.g., 64 bits) of the memory line is done at a similar time, such as a same clock cycle. The bank 750b uses accesses and arrangements similar to those used in the bank 750a.

Figure 8:
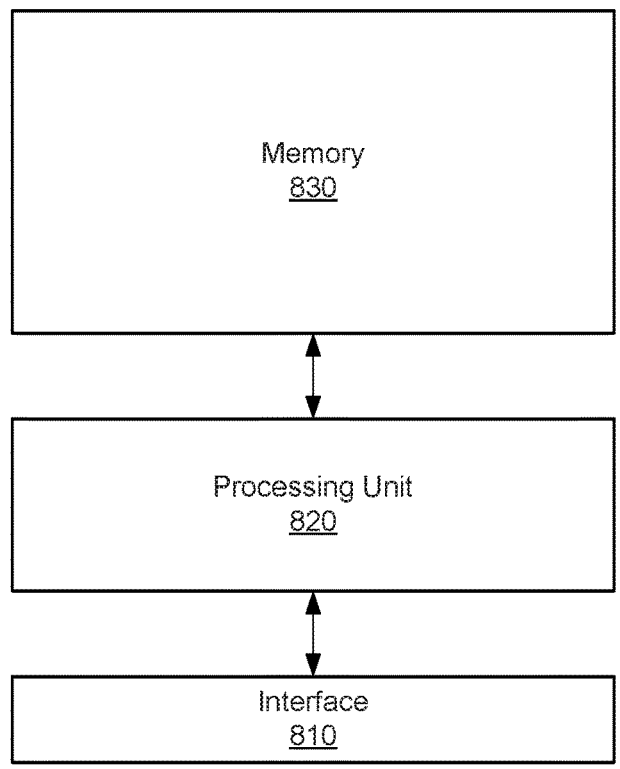
FIG. 8 is a block diagram of an embodiment of a computing system.

Referring to FIG. 8, one embodiment of a computing system 800 is shown. Generally speaking, the computing system 800 uses a processing unit 820, a memory 830, and an interface 810. In some embodiments, the functionality of the computing system 800 is included as components on a single die, such as a single integrated circuit. In other embodiments, the functionality of the computing system 800 is included as multiple dies on a system-on-a-chip (SOC). In some embodiments, the computing system is used in a desktop, a portable computer, a mobile device, a server, a peripheral device, or other.

In various embodiments, the interface 810 uses interface control logic for communicating with devices and units located externally to the computing system 800. The control logic in the interface 810 operates according to communication protocols corresponding to external units. The interface 810 uses buffers for storing both internally and externally generated requests and results.

The processing unit 820 processes instructions of a predetermined algorithm. The processing includes fetching instructions and data, decoding instructions, executing instructions and storing results. The processing unit 820 is one of a general-purpose microprocessor, an application specific integrated circuit (ASIC), a single-instruction-multiple-data (SIMD) microarchitecture processor, and so forth. While executing instructions, the processing unit 820 performs calculations and generate memory access requests.

The memory 830 is accessed for the fetching operations and the generated memory access requests, which include storing results. In some embodiments, the memory 830 is a cache hierarchy memory subsystem. In other embodiments, the memory 830 is a random access memory (RAM). In yet other embodiments, the memory 830 is a set of one or more buffers. In still yet other embodiments, the memory 830 is a field programmable gate array (FPGA). Although a single memory is shown, in various embodiments, multiple memories are used in the computing system 800. In some embodiments, the memory 830 is a complete memory. In other embodiments, the memory 830 is a portion of a memory subsystem.

In various embodiments, multiple copies of each of a first block and a neighboring second block are placed in the computing system 800. In some embodiments, the multiple copies of the first block and the second block are in the interface 810. In other embodiments, the multiple copies are in the processing unit 820. In yet other embodiments, the multiple copies are in the memory 830. Each of the first block and the second block has a metal track plan, but the metal track plans are unaligned. Using steps described earlier, an offset is determined for moving the metal track plan for the second block to align with the metal track plan of the first block. The placement of the copies of the second block are shifted in relation to the first block by an amount equal to the offset. Now, the same unidirectional pattern defined by the metal track plan for the first block is used for placing tracks across the first block and the second block.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
a first block comprising a first plurality of transistors configured to provide first partial functionality of the integrated circuit, wherein the first block has a first metal track;
a second block comprising a second plurality of transistors configured to provide second partial functionality of the integrated circuit different from the first partial functionality, wherein the second block:
has a second metal track; and
communicates with the first block using at least the first metal track and the second metal track; and
wherein the second block is placed such that a top of the second block is unaligned with a top of the first block by an offset, and wherein:
a height of the first block is equal to a height of the second block; and
each metal track across the first block and the second block is a track with a unidirectional pattern.

2. The integrated circuit as recited in claim 1, wherein:
each of the first block and the second block is instantiated a first number of times with a top of each copy of the second block being unaligned with a top of a respective copy of the first block by the offset; and
the first metal track is instantiated a second number of times greater than the first number of times.

3. The integrated circuit as recited in claim 2, wherein the unidirectional pattern of the first metal track comprises a width and a pitch for a given metal layer with no bends used for routing signals across the first block and the second block.

4. The integrated circuit as recited in claim 2, wherein each metal track across the first block and the second block has a same width in the second block as it has in the first block.

5. The integrated circuit as recited in claim 2, wherein at least a third block different from each of the first block and the second block is placed in an unoccupied area created by the unaligned placement of the second block with respect to the first block.

6. The integrated circuit as recited in claim 2, wherein the second block abuts the first block.

7. The integrated circuit as recited in claim 2, wherein the integrated circuit is a memory, and wherein the first block is a memory bit cell and the second block is a periphery block comprising control logic for accessing the memory bit cell.

8. A method, comprising:
determining a first metal track plan for a first block comprising a first plurality of transistors that provides first partial functionality of an integrated circuit;
determining a second metal track plan for a second block comprising a second plurality of transistors that:
provides second partial functionality of the integrated circuit different from the first partial functionality; and
communicates with the first block with one or more metal tracks across the first block and the second block;
in response to determining the first metal track plan and the second metal track plan are unaligned with respect to one another:
determining an offset for moving each track of the second metal track plan such that each of the one or more metal tracks across the first block and the second block is:
a track with a unidirectional pattern; and
aligned with the first metal track plan; and
shifting placement of the second block with a height equal to a height of the first block such that a top of the second block is unaligned with a top of the first block by the offset.

9. The method as recited in claim 8, wherein:
instantiating each of the first block and the second block a first number of times with a top of each copy of the second block being unaligned with a top of a respective copy of the first block by the offset; and
instantiating the first metal track plan a second number of times greater than the first number of times.

10. The method as recited in claim 9, wherein the unidirectional pattern of the first metal track plan comprises a width and a pitch for a given metal layer with no bends used for routing signals across the first block and the second block.

11. The method as recited in claim 9, further comprising widening one or more metal tracks of the second metal track plan after moving by the offset to align the one or more metal tracks for the second block with the first block.

12. The method as recited in claim 9, wherein determining an offset for moving each track of the second metal plan comprises:
selecting a first track in the first metal track plan;
selecting a second track in the second metal track plan;
moving the second metal track plan by the offset to align the selected second track with the selected first track; and
determining each track of the second metal track plan is aligned with a track in the first metal track plan.

13. The method as recited in claim 9, further comprising placing at least a third block different from each of the first block and the second block in an unoccupied area created by the shifted placement of the second block.

14. The method as recited in claim 9, wherein the second block abuts the first block.

15. The method as recited in claim 9, wherein the first block is a memory bit cell and the second block is a periphery block comprising control logic for accessing the memory bit cell.

16. A system for generating a layout of an integrated circuit, the system comprising:
a processor; and
a non-transitory computer readable medium storing instructions, the instructions when executed by the processor causing the system to:
determine a first metal track plan for a first block comprising a first plurality of transistors that provides first partial functionality of an integrated circuit;
determine a second metal track plan for a second block comprising a second plurality of transistors that:
provides second partial functionality of the integrated circuit different from the first partial functionality; and
communicates with the first block with one or more metal tracks across the first block and the second block;
in response to determining the first metal track plan and the second metal track plan are unaligned with respect to one another:
determine an offset for moving each track of the second metal track plan to align with a track of the first metal track plan such that each of the one or more metal tracks across the first block and the second block is:
a track with a unidirectional pattern; and
aligned with the first metal track plan; and shift placement of the second block with a height equal to a height of the first block such that a top of the second block is unaligned with a top of the first block by the offset.

17. The system as recited in claim 16, wherein:
instantiate each of the first block and the second block a first number of times with a top of each copy of the second block being unaligned with a top of a respective copy of the first block by the offset; and
instantiate the first metal track plan a second number of times greater than the first number of times.

18. The system as recited in claim 17, wherein the unidirectional pattern of the first metal track plan comprises a width and a pitch for a given metal layer with no bends used for routing signals across the first block and the second block.

19. The system as recited in claim 17, wherein the program instructions are further executable to widen one or more metal tracks of the second metal track plan after moving by the offset to align the one or more metal tracks for the second block with the first block.

20. The system as recited in claim 17, wherein the program instructions are further executable to:
select a first track in the first metal track plan;
select a second track in the second metal track plan;
move the second metal track plan by the offset to align the selected second track with the selected first track; and
determine each track of the second metal track plan is aligned with a track in the first metal track plan.

\* \* \* \* \*